United States Patent [19]

Tabei et al.

[11] Patent Number: 4,860,076
[45] Date of Patent: Aug. 22, 1989

[54] SOLID STATE IMAGE DEVICE

[75] Inventors: Masatoshi Tabei; Mitsuru Ikeda, both of Asaka; Yosuke Nakajima, Fujinomiya, all of Japan

[73] Assignee: Fuji Photo Film Co., Ltd., Japan

[21] Appl. No.: 277,414

[22] Filed: Nov. 29, 1988

Related U.S. Application Data

[63] Continuation of Ser. No. 293,170, Aug. 17, 1981, abandoned.

[30] Foreign Application Priority Data

Aug. 22, 1980 [JP]  Japan .................................. 55-115545

[51] Int. Cl.$^4$ ................... H01L 45/00; H01L 27/12; H01L 27/14; H01L 29/161
[52] U.S. Cl. .......................................... 357/30; 357/2; 357/4; 357/61
[58] Field of Search ............................ 357/2.4, 30, 61

[56] References Cited

U.S. PATENT DOCUMENTS

| 4,226,898 | 10/1980 | Ovshinsky et al. ............... 357/2 X |
| 4,239,554 | 12/1980 | Yamazaki .......................... 357/2 X |
| 4,354,104 | 10/1982 | Chikamura et al. ............. 357/30 X |
| 4,360,821 | 11/1982 | Tsukada et al. ................. 357/30 X |

FOREIGN PATENT DOCUMENTS

55/11329  1/1980  Japan ..................................... 357/59

Primary Examiner—J. Carroll
Attorney, Agent, or Firm—Pasquale A. Razzano

[57] ABSTRACT

A solid state imaging device comprises a transparent electrode, a photoconductive layer, and a plurality of scanning circuits for consecutively selecting signals in the photoconductive layer. The photoconductive layer is formed of amorphous semiconductor comprising amorphous silicon as the major component and further containing an element serving to lower the capture level within the energy gap and a trace amount of chalcogen element as a chemical modifier.

4 Claims, 1 Drawing Sheet

SOLID STATE IMAGE DEVICE

This application is a continuation of application Ser. No 293,170, filed Aug. 17, 1981, abandoned.

BACKGROUND OF THE INVENTION

1. Field of the Invention

This invention relates to a solid state imaging device, and more particularly to a solid state imaging device having a photodetecting portion of amorphous silicon.

2. Description of the Prior Art

Conventional solid state imaging devices generally comprise a photodetecting portion such as formed of photodiodes arranged in a matrix form, and scanning circuits for selecting signals detected by the photodetecting portion. For example, Japanese Patent Publication No. 45(1970)-30768 discloses a solid state imaging device which comprises a photodetecting portion in a matrix form combined with a field effect transistor circuit for X-Y scanning. (Hereinafter this type will be referred to as X-Y matrix type.) There also have been known such solid state imaging devices including a photodetecting portion in a matrix form combined with another scanning circuit such as a Bucket Brigade Device (BBD), a Charge Coupled Device (CCD) or a Charge Priming Transfer (CPT) type charge transfer portion. See Japanese Unexamined Patent Publication Nos. 46(1971)-1221 and 47(1972)-26091, and "Electronics Material" P. 6 et seq., March 1980.

However, these conventional solid state imaging devices are disadvantageous in that the light utilization efficiency per unit area is very low since the photodetecting portion and the circuit for consecutively selecting signals detected by the photodetecting portion (including said X-Y matrix circuit, said charge transfer circuit and a field effect transistor functioning as a switching element for delivering an electric charge to the circuits) are two dimensionally arranged in a common plane.

Recently, there has been developed a solid state imaging device employing a photoconductive layer as the photodetecting portion, in which the photoconductive layer is disposed on said scanning circuit to form a multilayer structure, thereby increasing the light utilization efficiency thereof. For example, Japanese Unexamined Patent Publication No. 49(1974)-91116 discloses a solid state imaging device comprising a photoconductive layer disposed on an X-Y matrix type scanning circuit using field effect transistors. Further, in Japanese Unexamined Patent Publication No. 55(1980)-27772, there is disclosed a solid state imaging device comprising a BBD type or CCD type scanning circuit and a polycrystal evaporation layer disposed thereon of II-VI group compound semiconductor having heterojunction.

On the other hand, positive attempts have been made to utilize amorphous silicon as a semiconductor for a solar battery or electrophotographic photosensitive material. The amorphous silicon differs from crystal silicon in that the former has no periodicity in its atomic arrangement while the latter has a long periodic system in its atomic arrangement. Thus, the conventional amorphous silicon exhibits very inferior photo-electric characteristics because of the structure defect due to its aperiodicity. However, it has been found that amorphous silicon including hydrogen and/or fluorine serving to lower the gap state of electrons and positive holes within the energy gap of the amorphous silicon exhibits high photoconductivity with relatively high resistivity ($10^{8-9}$ Ωcm). Furthermore, it has been found that the conductivity of such amorphous silicon can be controlled by doping impurity like the crystal silicon. See for example W. E. Spear and P. G. Le Comber, "Solid State Communication" vol. 17, 1975, P. 1193 et seq. Thus, the impurity doped amorphous silicon is highly attentioned in the fundamental field and the applied field with the primary application thereof directed to a photovoltaic element, as described in D. E. Carlson and C. R. Wronski, "Applied Physics Letters" vol. 28, 1976, P. 671 et seq.

There has been made an attempt to use such amorphous silicon as the photoconductive layer in the solid state imaging device of multilayer structure as set forth in Japanese Unexamined Patent Publication No. 55(1980)-39404. The solid state imaging device includes a single layer of amorphous silicon formed so as to be electrically connected to the source electrode or the drain electrode of a field effect transistor of an X-Y matrix type or a charge transfer type scanning circuit associated with MOS type field effect transistors arranged in a matrix form, and a transparent electrode superposed thereon.

However, in accordance with our experiments, it is very difficult to obtain amorphous silicon having both high dark resistivity and high photoconductivity. That is, when the dark resistivity is improved, the photoconductivity is lowered, and vice versa.

For example, when the temperature of a substrate on which a layer of amorphous silicon is to be formed is maintained at a low temperature not higher than 250° C. during glow discharge in silane in order to obtain amorphous silicon having high resistivity as high as $10^{12}$ Ωcm which is required for the photodetecting layer of a solid state imaging device, the resulting amorphous silicon generally has inferior photoconductive characteristics particularly with low sensitivity especially in a low potential electric field. This is considered to be caused by increased lattice defects in the layer. Further, it has also been known to produce amorphous material having high dark resistivity by adding a small amount of methane to silane when subjecting it to glow discharge, thereby substituting carbon atoms, a homologue of silicon, for some silicon atoms. However, even with this method, the photoconductive characteristics of the material are degraded if the dark resistivity thereof is increased.

On the other hand, when the temperature of said substrate is maintained at a relatively high temperature equal to or higher than 250° C. in order to improve the photoconductive characteristics, the resulting amorphous silicon would exhibit low resistivity ($10^{8-9}$ Ωcm) and the solid state imaging device using same would exhibit an inferior S/N ratio with dark current. Therefore, in general, in making a silicon layer, the high dark resistivity and the high photoconductivity conflict with each other, and accordingly, it is very difficult to obtain a silicon layer having both of these desirable properties.

SUMMARY OF THE INVENTION

The present inventors have found that a solid state imaging device having superior properties compared with conventional ones can be obtained by forming the photoconductive layer of the photodetecting portion with amorphous semiconductor comprising amorphous silicon as the major component and containing an element serving to lower the capture level within the energy gap such as hydrogen and fluorine, and a chalcogen element as chemical modifier. Hereinafter, this material will be referred to as "chalcogen-modified amorphous silicon with capture-reducing element".

Accordingly, the primary object of the present invention is to provide a solid state imaging device comprising scanning circuits and a novel photoconductive layer of amorphous semiconductor superposed thereon having improved photoelectric characteristics and stability required for the photodetecting portion of a solid state imaging device.

The solid state imaging device in accordance with the present invention comprises a photoconductive layer, a transparent electrode disposed thereon on the light entrance side, and a plurality of scanning circuits for consecutively selecting signals of the photoconductive layer disposed beneath the photoconductive layer, characterised in that said photoconductive layer is formed of amorphous semiconductor comprising the chalcogen-modified amorphous silicon with capture-reducing element.

In accordance with our experiment, by adding a trace amount of chalcogen element to amorphous silicon, the dark conductivity of the amorphous silicon can be lowered by 0.5 to 1 figure, and the photoconductivity thereof can be increased by 0.5 to 1 figure depending upon the amount of chalcogen element added, which results in increase of the S/N ratio by 1 to 2 figures.

DESCRIPTION OF THE PREFERRED EMBODIMENTS

Figure 1:
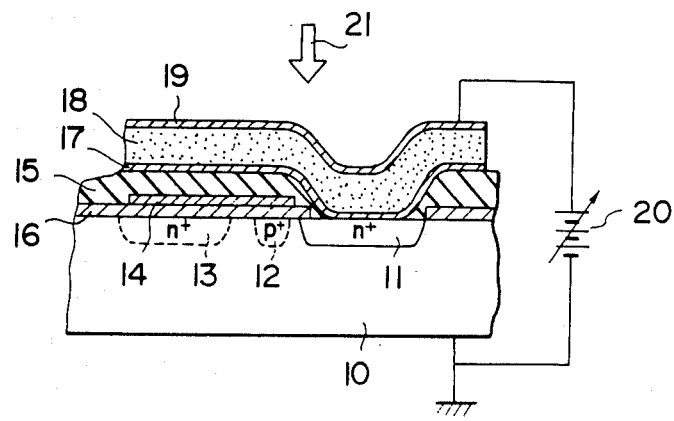
FIG. 1 is a cross sectional view showing a unit of a solid state imaging device in accordance with an embodiment of the present invention.

FIG. 1 shows in cross section a unit of a solid state imaging device in accordance with an embodiment of the present invention employing a charge transfer type scanning circuit. In FIG. 1, a p-type semiconductor substrate 10 includes an $n^+$-type region 11 defining a diode. A $p^+$-type region 12 shown in phantom defines a potential barrier for preventing injection of electrons from the $n^+$-type region 11 in CCD operation. This $p^+$-type region 12 is provided when a CCD is used as the scanning circuit. An $n^+$-type region 13 shown in phantom defines a potential well used in case of BBD operation and accordingly is provided when a BBD is used as the scanning circuit. Hereinafter the BBD operation will be described as an example.

A first gate electrode indicated at 14 is partly overlapped with the $n^+$-type region 11. Between the first gate electrode 14 and the semiconductor substrate 10 is disposed a dielectric layer or a gate oxide layer 16. A dielectric layer 15 electrically isolates a first electrode 17 from the first gate electrode 14 and the semiconductor substrate 10. The first electrode 17 forms an electrode of a diode electrically connected to the $n^+$-type region 11. On the first electrode 17 is superposed a photoconductive layer 18 formed of amorphous material comprising silicon and carbon as the major components and further containing hydrogen and fluorine. The photoconductive layer 18 may comprise two or more layers, if necessary. For example, the photoconductive layer 18 may have a p-n junction or a p-i-n junction, the p-type layer and the n-type layer being as a hole blocking layer and an electron blocking layer, respectively. The p-type layer and the n-type layer can be obtained by impurity doping the chalcogen-modified amorphous silicon with capture-reducing element as will be described in detail hereinafter. On the photoconductive layer 18 is provided a second or transparent electrode 19 to which a voltage is imparted by a power source 20.

The polarity of the voltage imparted to the transparent electrode 19 is negative in case that the layer of the photoconductive layer 18 adjacent to the first electrode 17 is of n-type, and is positive when the layer is of p-type. When such a blocking layer does not exist, either voltage may be imparted. Thus, the voltage applied to the transparent electrode 19 should have a polarity which can impart a reverse-biasing potential to the interface between the layers constituting the photodetecting portion.

When the photodetecting portion or the photoconductive layer 18 of the solid state imaging device of this embodiment is exposed to incident light 21, the photoconductive layer 18 generates hole-electron pairs by photon absorption which subsequently migrate to the electrodes 17 and 19, whereby the potential at the electrode 17 is lowered. The potential drop at the electrode 17 is proportional to the amount of the incident light 21 and is accumulated for a period of one field. When read-out signal voltage is subsequently applied to the first gate electrode 14, the surface potential of the semiconductor thereunder is increased, whereby electron transfer from the $n^+$ region 11 to the $n^+$ region 13 is effected. Accordingly, the potential at the $n^+$ region 11 is returned to the original level. Thus, the total amount of the charge transferred to the $n^+$ region 13 is proportional to the intensity of the incident light 21.

Charge transfer of the photoelectric conversion signal thus stored in the $n^+$ region 13 may be effected by any suitable known method.

Figure 2:
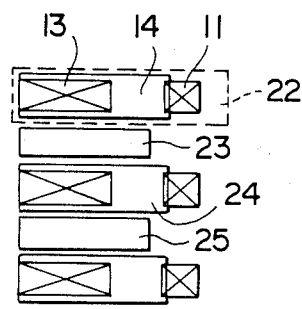
FIG. 2 is a schematic plan view showing linearly arranged three units of the solid state imaging device shown in FIG. 1.

For example, the charge transfer can be effected by conducting self-scanning as described hereinbelow. FIG. 2 is a schematic plan view showing linearly arranged three units of the solid state imaging device shown in FIG. 1 in which a portion surrounded by a broken line 22 corresponds to one unit of FIG. 1. Between the first gate electrodes 14 and 24 of an adjacent pair of units are disposed second gate electrodes 23 and 25. The charge introduced at the first gate electrode 14 by a well-known pulse imparting operation is transferred to the region under the second gate electrode 23 in the form of charge transfer when transfer pulses are imparted thereto. The charge transferred to the region under the second gate electrode 23 is further transferred to the first gate electrode 24 of the adjacent unit and then to the next second gate electrode 25, and thus finally transferred to the output stage. The photoelectric-converted signal at the photodetecting portion can thus be transferred to the output stage by use of two phase clock signals.

Although the above description is made with respect to a scanning circuit of charge transfer type such as CCD and BBD, it of course is possible to use instead therefor a scanning circuit of X-Y matrix type such as described in the above mentioned Japanese Unexamined Patent Publication No. 49(1974)-91116. Further, instead of the field effect transistor circuit of the above described type, a thin-film field effect transistor circuit formed on a glass substrate may be utilized. Such a thin-film field effect transistor circuit is disclosed in "Proceeding of the IEEE", The Institute of Electrical and Electronics Engineers, Inc., Vol. 52, No. 12, P. 1479-P. 1486, December, 1964. Further, the scanning circuit may be constituted of a known semiconductor switching circuit.

Now, a method of forming the photodetecting portion or the photoconductive layer employed in the solid state imaging device of the present invention will be described hereinbelow.

The amorphous semiconductor used in the solid state imaging device of the present invention can be produced by utilizing various methods of producing conventional a-SiH such as, for example, (1) glow discharge deposition (GD method) in which a-SiH is produced by discharge deposition of gaseous silane or silane derivative (See for example "Advance Physics" vol. 26, No. 6, 1977, P. 312 et seq.), (2) a sputtering method in which a silicon target is sputtered in a gaseous atmosphere containing hydrogen (See for example "Solid State Communications" vol. 20, 1976, P. 969 et seq.), (3) an ion plating method in which vapor of silicon is passed through a gas discharge atmosphere containing hydrogen, and (4) a CVD method in which gaseous silane is pyrolytically decomposed.

A suitable amount of chalcogen element is added to the amorphous semiconductor or a-SiH thus obtained during or after production thereof.

For example, in the glow discharge method, inert gas, gaseous silane or silane derivative, and gas including chalcogen element are mixed in an adequate ratio and are caused to react with each other.

As the silane or silane derivative, for example, the following compounds may be used. Silane, disilane, trisilane, tetrasilane, silicoethylene, silicoacetylene, silane halide, tetrachlorosilane, hexachlorodisilane, octachlorotrisilane, decachlorotetrasilane, dodecachloropentasilane, chlorosilane, dichlorosilane, trichlorosilane, $SiBrCl_3$, $SiBr_2Cl_2$, $SiBr_3Cl$, $SiCl_3SH$, $(SiCl_3)_2O$, $SiClF_3$, $SiCl_2F_2$, $SiCl_3F$, $SiICl_3$, $SiI_2Cl_2$, $SiI_3Cl$, $SiBr_4$, $Si_2Br_6$, $Si_3Br_8$, $Si_4Br_{10}$, $SiBrCl_3$, $SiBr_2Cl_2$, $SiBr_3Cl$, $SiFCl_2Br$, $SiFClBr_2$, $SiF_3Br$, $SiF_2Br_2$, $SiFBr_3$, $SiF_4$, $Si_2F_6$, difluorosilane, trifluorosilane, $SiH_2Cl_2$, $SiHClF_2$, iodosilane, $SiH_2I_2$, $SiHI_3$, bromosilane, $SiH_2Br_2$, $SiHBr_3$, $Si_2I_6$, $SiICl_3$, $SiI_2Cl_2$, $SiI_3Cl$, disiloxane, silylamine and trichloromethylsilane.

Gas including at least one of silane and silane derivative such as described above is diluted with inert gas, e.g., He, Ne, Ar, Kr, Xe, and is introduced into a glow discharge deposition apparatus together with gas containing chalcogen. Then the gases introduced into the apparatus are subjected to high frequency or direct current glow discharge to be decomposed and the decomposition products are caused to react with each other. Said gas containing chalcogen may comprise one or more of gaseous chalcogen elements and gasifiable chalcogen compounds such as $H_2S$, $H_2Se$, $H_2Te$, aryl selenide, and alkyl selenide. When said gaseous silane or silane derivative used does not contain an element serving to lower the capture level within the energy gap, e.g., hydrogen or fluorine, at least one of $H_2$, $F_2$ and HF should also be introduced into the apparatus.

In the sputtering method, a target material consisting of single crystal silicon or polycrystalline silicon including desired chalcogen, or a target material essentially solely consisting of silicon is sputtered by impact of ions, e.g., Ar ions generated by high frequency or direct current glow discharge, and the target composition is caused to react with said gaseous chalcogen (and/or gaseous chalcogen compound), organic gas, fluorine system gas and $H_2$.

Further, the chalcogen-modified amorphous silicon with capture reducing element can be produced by an ion implantation method by implanting ions of chalcogen elements and ions of capture reducing elements such as hydrogen and fluorine, in an amorphous silicon layer.

The chalcogen-modified amorphous silicon with capture-reducing element used in the present invention may be produced using one of the above methods or using two or more of the above methods together.

The amount of chalcogen element may be very small relative to the amount of the matrix material comprising amorphous silicon including elements for lowering the capture level of electrons and holes within the energy gap, and may be not more than 0.1 atomic percent. Further, in some cases only several tens of ppm of chalcogen element is effective. Of course, the amount of chalcogen element may be as large as 1 atomic percent.

The amount of fluorine added to the amorphous semiconductor as the capture-reducing element may be 1 to 30 atomic percent, preferably 5 to 20 atomic percent. The amount of hydrogen added to the amorphous semiconductor may be 1 to 40 atomic percent, preferably 5 to 30 atomic percent. The amount of hydrogen and fluorine can be controlled by controlling the temperature of the substrate and/or the amount of hydrogen and fluorine introduced into the apparatus.

It is possible to control the conductivity of the chalcogen-modified amorphous silicon with capture-reducing element by doping. That is, p-type characteristics can be given to the amorphous material by adding thereto a trace amount of B, for example. On the other hand, an n-type semiconductor can be made by adding thereto a small amount of P, for example. When making a p-type semiconductor, elements of III group such as B, Al, Ga, In, and Tl are suitable as the impurity for doping, while, when making an n-type semiconductor, elements of V group such as N, P, As, Sb and Bi are suitable. Although, the problem of environmental pollution is not so significant in the case of the impurities as compared with the major components since the amount thereof is very small, it should be preferred to use a material which pollutes the environment as little as possible. From this point of view and from the viewpoint of the electrical and optical characteristics of the obtained photoconductive layer, B and P, for example, are most suitable as the doping impurity. If desired, an electron blocking layer or a hole blocking layer, or p-n junction or p-i-n junction may thus be formed in the photoconductive layer.

The amount of the doping impurity is determined depending upon the desired electrical and optical characteristics of the obtained photoconductive layer, and is generally $10^{-6}$ to 5 atomic percent in case of III group impurity, with the preferable range thereof being from $10^{-5}$ to 1 atomic percent, while in case of V group impurity, the amount thereof is generally $10^{-6}$ to 1 atomic percent, with the preferred range thereof being from $10^{-4}$ to $10^{-1}$ atomic percent.

However, the amount of the doping impurity varies depending upon other conditions such as the temperature of the substrate on which the photoconductive layer is to be formed, and therefore the above values are not critical.

The impurity doping is effected in different ways depending upon the method of producing the amorphous semiconductor. For example, when the amorphous semiconductor is produced by glow discharge deposition, a gas such as $B_2H_6$, $AsH_3$, $PH_3$ or $SbCl_5$ is introduced into the glow discharge apparatus to be activated by glow discharge, and the amorphous semiconductor is exposed to the gas atmosphere during or after formation thereof. When a sputtering method is used, the impurity doping may be effected in the same manner, or may be effected by sputtering doping element simultaneously with sputtering the silicon target. When an ion implantation method is used, the impurity doping may be effected by implanting ions of the doping elements.

Although, the amorphous semiconductor used in the present invention comprises silicon as the major component, if desired, it may include a suitable amount of carbon and germanium.

The amorphous semiconductor used in the present invention exhibits excellent photoconductive characteristics, and it is believed that in the amorphous semiconductor, traps and recombination units in the forbidden band thereof are reduced compared with those of conventional a-SiH due to chemical modification of chalcogen elements.

Further, the transparent electrode 19 may be formed by sputtering. The transparent electrode thus formed comprises $In_2O_3$ or $SnO_2$ and has a thickness of 0.05 to 0.5μ.

Now, several examples for proving that the amorphous semiconductor used in the solid state imaging device according to the present invention has improved characteristics will be described hereinbelow.

EXAMPLE 1

The space between the cathode and anode of a parallel flat plate type sputtering apparatus (SPF-332, Nichiden Varian K.K.) was adjusted to 4.5 mm. On the anode was mounted a glass plate of 10 mm×25 mm×0.8 mm (#7059, Corning Glass Works) provided with a comb shaped electrode of an alminium conductive layer having a thickness of 0.2μ, and on the cathode was mounted a glass plate of 10 cm×10 cm×0.8 mm (#7059, Corning Glass Works). The interior of the chamber was evacuated to form a vacuum of not higher than $10^{-6}$ torr. Thereafter, a gaseous mixture of 100% silane gas (Nippon Sanso K.K.), gaseous $H_2Se$ and Ar with the concentration of $H_2Se$ being 267 ppm was introduced into the evacuated chamber. The ratio of silane to $H_2Se$ was adjusted by changing the setting of the mass flow controller. A gas introduction line was constituted of a pressure control valve (Nippon Sanso K.K., 1301P), a gas flow meter (mass flow controller), a stop valve and stainless steel pipes of ¼" diameter. At the inlet for the gaseous mixture into the chamber were provided a wire mesh and a buffer plate to slow down the flow speed of the mixture. The inner pressure of the chamber was reduced to 1.0 torr by controlling the amount of gas introduced into the chamber while evacuating gas outlet from the chamber with a rotary pump. Then glow discharge was conducted by supplying a high frequency current (13.56 MHz) to the cathode with the travelling wave, reflecting wave and difference of 40 W, 10 W and 30 W, respectively. The temperature of the substrate was maintained constant at 300° C. using a heater and a hot water controller disposed on the anode side.

As can be seen from the following Table 1, dark conductivity rod of amorphous semiconductor layer deposited on the anode depends upon the ratio of $H_2Se$ to $SiH_4$, and is lowered when selenium is added. Table 1 further shows variations in photoconductivity $\Delta\sigma l$ and S/N ratio, i.e., $\Delta\sigma l/\sigma d$, of the amorphous semiconductor when exposed to light from a white light source of a xenon short arc lamp provided with an infrared filter. As can be seen, both the values increase as the ratio of $H_2Se$ to $SiH_4$ is increased.

TABLE 1

| Sample No. | $N_{H_2Se}/N_{SiH_4}$ | dark conductivity $\sigma d$ $(\Omega cm)^{-1}$ | photoconductivity (15 mw/cm$^2$) $\Delta\sigma l$ $(\Omega cm)^{-1}$ | S/N ratio |
|---|---|---|---|---|
| reference | 0 | $1.6 \times 10^{-9}$ | $2.5 \times 10^{-6}$ | $1.56 \times 10^3$ |
| layer (Se contained) (1) | $4.39 \times 10^{-6}$ | $2.33 \times 10^{-10}$ | $4.33 \times 10^{-6}$ | $1.86 \times 10^4$ |
| layer (Se contained) (2) | $1.32 \times 10^{-5}$ | $7.58 \times 10^{-11}$ | $5.95 \times 10^{-6}$ | $7.8 \times 10^4$ |
| layer (Se contained) (3) | $4.39 \times 10^{-5}$ | $2.13 \times 10^{-10}$ | $1.65 \times 10^{-5}$ | $7.75 \times 10^4$ |
| layer (Se contained) (4) | $1.32 \times 10^{-4}$ | $6.53 \times 10^{-10}$ | $6.17 \times 10^{-5}$ | $9.45 \times 10^4$ |

On the other hand, fine particles of amorphous silicon were deposited on the cathode. The particles were compression-molded and the conductivity thereof was measured. As shown in Table 2, as the ratio of $H_2Se$ to $SiH_4$ is increased, the dark conductivity is lowered and the photoconductivity is increased, which results in an increase of the S/N ratio.

TABLE 2

| Sample No. | $N_{H_2Se}/N_{SiH_4}$ | dark conductivity $\sigma d$ $(\Omega cm)^{-1}$ | photoconductivity (15mw/cm$^2$) $\Delta\sigma l(\Omega cm)^{-1}$ | S/N ratio |
|---|---|---|---|---|
| reference | 0 | $1.62 \times 10^{-11}$ | $3.65 \times 10^{-8}$ | $2.25 \times 10^3$ |
| particle (Se contained) (1) | $4.39 \times 10^{-6}$ | $7.17 \times 10^{-12}$ | $5.66 \times 10^{-8}$ | $7.9 \times 10^3$ |
| particle (Se contained) (2) | $1.32 \times 10^{-5}$ | $5.79 \times 10^{-12}$ | $5.79 \times 10^{-8}$ | $1.0 \times 10^4$ |

TABLE 2-continued

| Sample No. | $N_{H_2Se}/N_{SiH_4}$ | dark conductivity $\sigma d\ (\Omega cm)^{-1}$ | photoconductivity (15mw/cm²) $\Delta\sigma l(\Omega cm)^{-1}$ | S/N ratio |
|---|---|---|---|---|
| particle (Se contained) (3) | $4.39 \times 10^{-5}$ | $3.0 \times 10^{-12}$ | $8.64 \times 10^{-8}$ | $2.88 \times 10^4$ |

EXAMPLE 2

Amorphous silicon including Se was produced using the same procedure as in the Example 1 except that the powers of the travelling wave, reflecting wave and difference of the supplied high frequency current were changed to 70 W, 10 W and 60 W, respectively, and the pressure within the chamber at the time of discharge was changed to 5.0 torr. As shown in Table 3, the dark conductivity of the obtained amorphous silicon is lowered when Se is added, while the photoconductivity thereof is increased as the ratio of H₂Se to SiH₄ is increased, as in Example 1.

TABLE 3

| Sample No. | $N_{H_2Se}/N_{SiH_4}$ | dark conductivity $\sigma d\ (\Omega cm)^{-1}$ | photoconductivity (15mw/cm²) $\Delta\sigma l(\Omega cm)^{-1}$ | S/N ratio |
|---|---|---|---|---|
| reference | 0 | $2.1 \times 10^{-9}$ | $2.4 \times 10^{-5}$ | $1.14 \times 10^4$ |
| (5) | $1.32 \times 10^{-5}$ | $6.21 \times 10^{-11}$ | $1.11 \times 10^{-5}$ | $1.78 \times 10^5$ |
| (6) | $4.39 \times 10^{-5}$ | $1.74 \times 10^{-10}$ | $2.48 \times 10^{-5}$ | $1.43 \times 10^5$ |
| (7) | $1.32 \times 10^{-4}$ | $1.09 \times 10^{-10}$ | $9.88 \times 10^{-5}$ | $9.06 \times 10^5$ |
| (8) | $4.39 \times 10^{-4}$ | $1.67 \times 10^{-10}$ | $1.81 \times 10^{-4}$ | $1.08 \times 10^6$ |

EXAMPLE 3

The ratio of H₂Se gas to silane gas was maintained constant at $1.32 \times 10^{-5}$ and increasing amounts of boron in the form of B₂H₆ were added as dopant for giving p-type conductive characteristics to the amorphous silicon. Then variations in the dark conductivity and the photoconductivity were measured. The results are shown in Table 4.

TABLE 4

| Sample No. | $N_{Se}/N_{Si}$ | dopant $N_{B_2H_6}/N_{Si}$ | $\sigma d\ (\Omega cm)^{-1}$ | $\Delta\sigma l\ (\Omega cm)^{-1}$ | S/N ratio |
|---|---|---|---|---|---|
| reference | $1.32 \times 10^{-5}$ | 0 | $7.58 \times 10^{-11}$ | $5.95 \times 10^{-6}$ | $7.8 \times 10^4$ |
| (9) | " | $4.5 \times 10^{-5}$ | $8.75 \times 10^{-12}$ | $5.25 \times 10^{-6}$ | $6 \times 10^5$ |
| (10) | " | $3 \times 10^{-4}$ | $3 \times 10^{-7}$ | $7.57 \times 10^{-6}$ | 25 |

As can be seen from Table 4, when doped with about $5 \times 10^{-5}$ of boron, the dark specific resistance of the amorphous silicon is significantly lowered. The amorphous silicon exhibits p-type conduction when doped with a larger amount of boron like the conventional a-SiH. However, it should be noted that the photoconductivity $\Delta\sigma l$ of the amorphous silicon in accordance with the present invention is not lowered by boron doping.

EXAMPLE 4

The ratio of H₂Se gas to silane gas was maintained constant as in Example 3, and phosphorus in the form of PH₃ was added as dopant for giving n-type conductive characteristics to the amorphous silicon. The P-doped amorphous silicon exhibited higher photoconductivity $\Delta\sigma l$ than a-SiH.

We claim:

1. In a solid state imaging device, an arrangement which comprises a photoconductive layer of amorphous semiconductor containing amorphous silicon as the major component, an element for reducing capture level within the energy gap and up to 0.1 atomic percent of selenium as a chemical modifier, said layer having disposed on the light-entrance side thereof a transparent electrode, and a plurality of scanning circuits for consecutively selecting signals of the photoconductive layer being disposed beneath that layer.

2. In a solid state imaging device, an arrangement as defined in claim 1 wherein said amorphous semiconductor further contains a III group element as a doping element for p-type conduction.

3. In a solid state imaging device, an arrangement as defined in claim 1, wherein said amorphous semiconductor further contains a V group element as a doping element for n-type conduction.

4. In a solid state imaging device, an arrangement as defined in claim 1, wherein said amorphous semiconductor contains at least one element for reducing capture level within the energy gap selected from the group consisting of hydrogen and fluorine.

* * * * *